United States Patent
Evans et al.

(10) Patent No.: US 12,123,983 B2
(45) Date of Patent: Oct. 22, 2024

(54) ALIGNING SENSORS ON VEHICLES USING SENSOR OUTPUT

(71) Applicant: THE BOEING COMPANY, Chicago, IL (US)

(72) Inventors: Nick S. Evans, Lynnwood, WA (US); Eric R. Muir, Bothell, WA (US); Kevin S. Callahan, Shoreline, WA (US)

(73) Assignee: The Boeing Company, Chicago, IL (US)

( * ) Notice: Subject to any disclaimer, the term of this patent is extended or adjusted under 35 U.S.C. 154(b) by 1582 days.

(21) Appl. No.: 16/393,388

(22) Filed: Apr. 24, 2019

(65) Prior Publication Data

US 2020/0341128 A1 Oct. 29, 2020

(51) Int. Cl.
*G01C 3/08* (2006.01)
*B60Q 1/26* (2006.01)
(Continued)

(52) U.S. Cl.
CPC .......... *G01S 7/4972* (2013.01); *B60Q 1/2642* (2013.01); *F16M 11/123* (2013.01); *B60R 2300/301* (2013.01); *G03F 1/38* (2013.01)

(58) Field of Classification Search
CPC .... G01S 7/4972; G01S 17/931; G01S 17/933; B60Q 1/2642; F16M 11/123; B60R 2300/301; G03F 1/38
See application file for complete search history.

(56) References Cited

U.S. PATENT DOCUMENTS

| | | | |
|---|---|---|---|
| 3,633,212 A * | 1/1972 | Cooper | F41G 7/301 |
| | | | 356/369 |
| 4,168,123 A * | 9/1979 | Price | G01B 11/00 |
| | | | 244/76 R |

(Continued)

FOREIGN PATENT DOCUMENTS

| | | |
|---|---|---|
| DE | 4222409 A1 | 1/1993 |
| DE | 102013021616 | 6/2015 |

(Continued)

OTHER PUBLICATIONS

Towards Data Science, *Tracking a self-driving car with high precision*, dated Apr. 30, 2017, 4 pgs.

(Continued)

*Primary Examiner* — Samantha K Nickerson
(74) *Attorney, Agent, or Firm* — Quinn IP Law (57) ABSTRACT

Systems and methods of aligning removable sensors mounted on a vehicle based upon sensor output of such sensors are described. Sensor output is collected from a removable sensor (e.g., a digital camera), and a representation of such sensor output is generated (e.g., a digital image). The representation of the sensor output is compared against a spatial template (e.g., a digital mask overlaid on the representation) to determine whether external references in the representation align with corresponding reference indicators in the spatial template. When alignment is required, the removable sensor is aligned by one or both of the following until the external references in a representation of sensor data at an updated current location align with the corresponding reference indicators in the spatial template: (i) adjusting the position of the removable sensor on the vehicle or (ii) adjusting the representation of the sensor output to simulate such repositioning.

21 Claims, 6 Drawing Sheets

(51) Int. Cl.
　　*F16M 11/12*　　　(2006.01)
　　*G01S 7/497*　　　(2006.01)
　　*G03F 1/38*　　　　(2012.01)

(56)　　　　References Cited

U.S. PATENT DOCUMENTS

| | | | |
|---|---|---|---|
| 4,790,651 | A | 12/1988 | Brown et al. |
| 6,020,844 | A | 2/2000 | Bai et al. |
| 6,418,775 | B1 | 7/2002 | Sager et al. |
| 6,653,650 | B2 * | 11/2003 | McMillan .............. G01C 25/00 250/548 |
| 6,744,399 | B2 | 6/2004 | Tohyama et al. |
| 8,259,174 | B2 | 9/2012 | Zhang et al. |
| 10,054,843 | B2 | 8/2018 | Ye |
| 10,073,178 | B2 | 9/2018 | Hara |
| 10,818,091 | B2 | 10/2020 | Evans et al. |
| 10,878,709 | B2 | 12/2020 | Dame et al. |
| 11,113,570 | B2 | 9/2021 | Muir et al. |
| 2006/0080004 | A1 * | 4/2006 | Cheok .................. G01C 15/14 701/1 |
| 2008/0186384 | A1 | 8/2008 | Ishii et al. |
| 2016/0209500 | A1 | 7/2016 | Markendorf |
| 2017/0103546 | A1 | 4/2017 | Wang et al. |
| 2018/0342082 | A1 | 11/2018 | Lewis et al. |

FOREIGN PATENT DOCUMENTS

| | | |
|---|---|---|
| DE | 202015106939 U1 | 4/2016 |
| DE | 102016206516 A1 | 10/2017 |
| EP | 1001274 A1 | 5/2000 |
| EP | 1031852 A2 | 8/2000 |
| EP | 1103823 A2 | 5/2001 |
| EP | 1340998 A1 | 9/2003 |
| EP | 2113787 A1 | 11/2009 |
| WO | WO-2015011323 A1 | 1/2015 |
| WO | WO-2018000037 A1 | 1/2018 |

OTHER PUBLICATIONS

Extended EP Search Report and Written Opinion for EP Application No. 20166586.6 dated Sep. 18, 2020.
Extended EP Search Report and Written Opinion for EP Application No. 20166580.9 dated Sep. 21, 2020.

\* cited by examiner

ALIGNING SENSORS ON VEHICLES USING SENSOR OUTPUT

FIELD

This disclosure relates to systems and methods for aligning removable sensors on a vehicle.

BACKGROUND

Computer vision systems are employed on vehicles to monitor the surrounding environment of the vehicle using various sensors and, in some instances, to control vehicle operation using the sensor data from digital cameras, Light Detection and Ranging (LIDAR) units, and similar sensors. Although computer vision techniques offer many benefits, they are sensitive to changes in location or orientation of the sensors. In order to utilize computer vision systems fully, the sensor positions during operation must be comparable to the sensor positions used in training (or other previous use) or model generation. Because sensors are occasionally removed or replaced over the operational life of a vehicle, sensor realignment must occur whenever a sensor is installed or reinstalled on the vehicle. Additionally, sensor location should be consistent across similar vehicles in order to facilitate the generation and use of computer vision systems that may be used on multiple similarly configured vehicles.

While sensor position is important to computer vision systems, sensor alignment presents particular difficulties. While initial sensor placement in a general area of a vehicle is easily done, such placement in an approximate area of the vehicle is insufficient to obtain the high degree of accuracy needed for optimal computer vision systems. Thus, further alignment of sensors is needed to ensure data accuracy.

SUMMARY

An example includes a method for aligning a removable sensor mounted on a vehicle, comprising: collecting sensor output from the removable sensor at each of a plurality of times, wherein the sensor output at each of the plurality of times is associated with a current position of the removable sensor on the vehicle; generating, by one or more processors, a representation of the sensor output at each of the plurality of times; and/or adjusting (i) the current position of the removable sensor based upon the representation of the sensor output and a spatial template including one or more reference indicators to position the removable sensor at a desired position on the vehicle, in which desired position one or more external reference features in the representation of the sensor output align with the one or more reference indicators in the spatial template, and/or (ii) the representation of the sensor output at the current position of the removable sensor to simulate the removable sensor being positioned at the desired position on the vehicle based upon the spatial template.

Another example includes a computer system for aligning a removable sensor mounted on a vehicle, including one or more processors communicatively connected to the removable sensor and a program memory communicatively connected to the one or more processors and storing executable instructions that, when executed by the one or more processors, cause the computer system to: collect sensor output from the removable sensor at each of a plurality of times, wherein the sensor output at each of the plurality of times is associated with a current position of the removable sensor on the vehicle; generate a representation of the sensor output at each of the plurality of times; and/or adjust (i) the current position of the removable sensor based upon the representation of the sensor output and a spatial template including one or more reference indicators to position the removable sensor at a desired position on the vehicle, in which desired position one or more external reference features in the representation of the sensor output align with the one or more reference indicators in the spatial template, and/or (ii) the representation of the sensor output at the current position of the removable sensor to simulate the removable sensor being positioned at the desired position on the vehicle based upon the spatial template.

Yet another example includes a tangible, non-transitory computer-readable medium storing executable instructions for aligning a removable sensor mounted on a vehicle, which executable instructions, when executed by one or more processors of a computer system, cause the computer system to: collect sensor output from the removable sensor at each of a plurality of times, wherein the sensor output at each of the plurality of times is associated with a current position of the removable sensor on the vehicle; generate a representation of the sensor output at each of the plurality of times; and/or determine whether the removable sensor is aligned with a desired position on the vehicle based upon the representation of the sensor output and a spatial template including one or more reference indicators by comparing a portion of the spatial template against a corresponding portion of the representation of the sensor output at a time of the plurality of times, in which desired position one or more external reference features in the representation of the sensor output align with the one or more reference indicators in the spatial template.

The features, functions, and advantages that have been discussed can be achieved independently in various embodiments or may be combined in yet other embodiments further details of which can be seen with reference to the following description and drawings.

DESCRIPTION

Disclosed herein are systems, methods, and non-transitory computer-readable media storing instructions for aligning one or more removable sensors on a vehicle, such as digital cameras or LIDAR units on an aircraft. The removable sensors disclosed herein generate sensor output as electronic data regarding the physical local environment around such removable sensors, such as a digital video feed or a three-dimensional spatial map of objects or surfaces in the environment observable by the removable sensors. The following disclosure generally relates to aligning such removable sensors in or on a vehicle using the sensor output to obtain a high degree of accuracy in alignment. The removable sensors may be aligned with previous positions of the same or similar removable sensors, such as when a removable sensor is reinstalled after maintenance or when a new removable sensor is installed to replace a previous removable sensor (e.g., after sensor failure). The removable sensors may likewise be aligned in a corresponding position on multiple vehicles to ensure consistency of sensor position (and thus ensure consistency of sensor data) between multiple vehicles that are similarly configured with removable sensors. Further details regarding such removable sensor alignment are described below.

Figure 1:
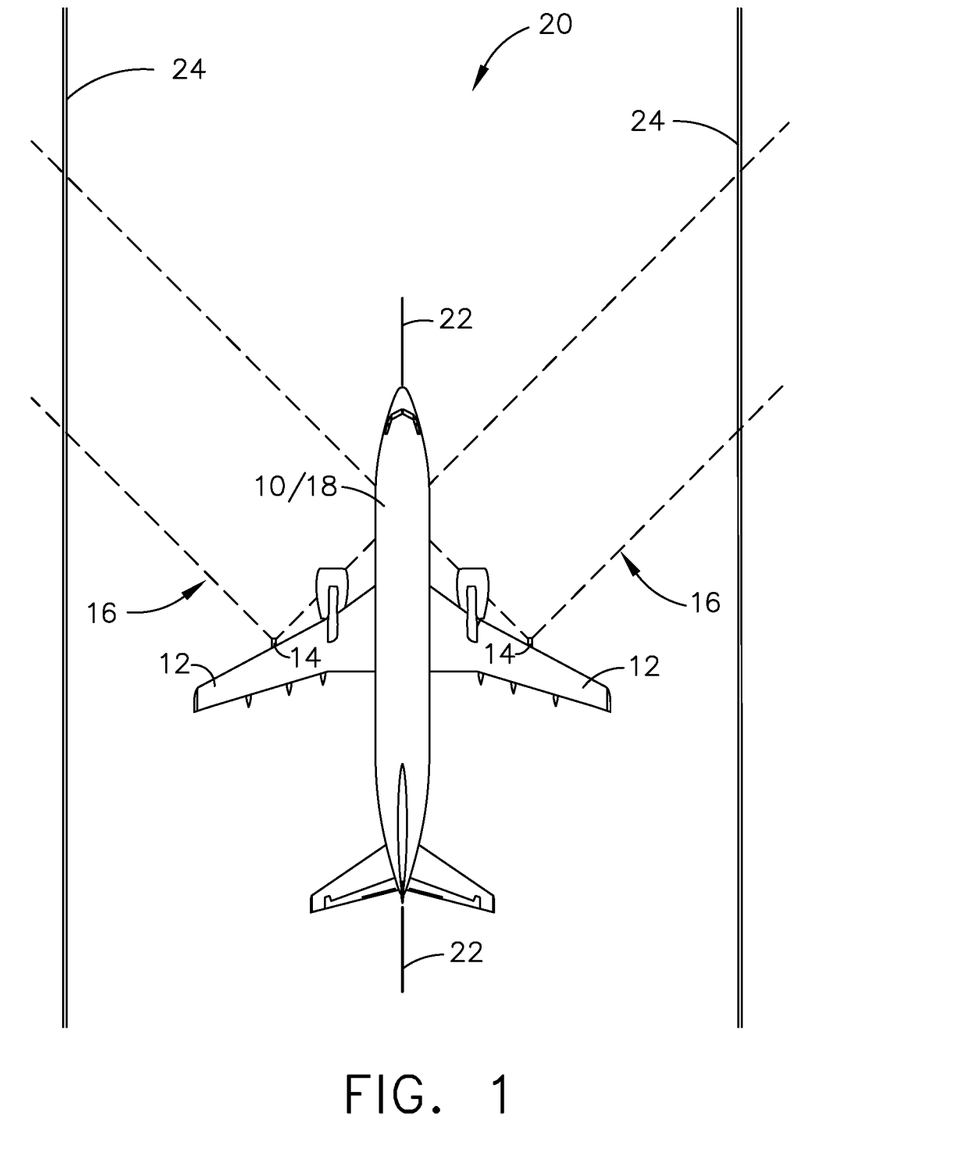
FIG. 1 is a top view of a vehicle having a plurality of removable sensors.

FIG. 1 illustrates a top view of an example of a vehicle 10 on which removable sensors 14 are mounted. Although the vehicle 10 is illustrated as an aircraft 18 (specifically, as a fixed-wing aircraft), the techniques described herein are applicable to aligning electronic sensors on other types of vehicles (e.g., automobiles, trains, other types of aircraft, ships, trucks, or industrial equipment). The vehicle 10 is illustrated as being positioned on a taxiway 20 for reference. The taxiway 20 has a centerline 22 for use in centering the vehicle 10 while traveling along the taxiway 20. The taxiway 20 also has edge lines 24 on each side that mark the edge of the usable portion of the taxiway 20. The vehicle 10 includes wings 12, which may include a left wing and a right wing. A plurality of removable sensors 14 are mounted on the vehicle 10 to capture sensor data for portions 16 of the taxiway 20 within the respective field of view of each removable sensor 14.

Each removable sensor 14 is an electronic imaging sensor that generates sensor output as electronic data at each of a plurality of times during sensor operation, from which sensor output a two-dimensional or three-dimensional graphical representation of the corresponding portion 16 of the local environment of the vehicle 10 can be generated. In various embodiments, the removable sensors 14 discussed throughout this document include one or more digital cameras, LIDAR units, radar units, ultrasonic sensor units, or other electronic devices configured to generate electronic images of portions of a local environment. In further embodiments, the removable sensors 14 discussed throughout this document include combinations of two or more of the foregoing types of removable sensors 14, which combinations improve the robustness of the system by using multiple types of image data. Although illustrated as having two removable sensors 14, the vehicle 10 may instead have one removable sensor 14 in other configurations, and the vehicle 10 may have more than two removable sensors 14 in still other configurations. As illustrated, some embodiments include one or more removable sensors 14 mounted on each side (e.g., on each wing 12) of the vehicle 10 to capture sensor data for distinct or partially overlapping portions 16 of the local environment.

Figure 2:
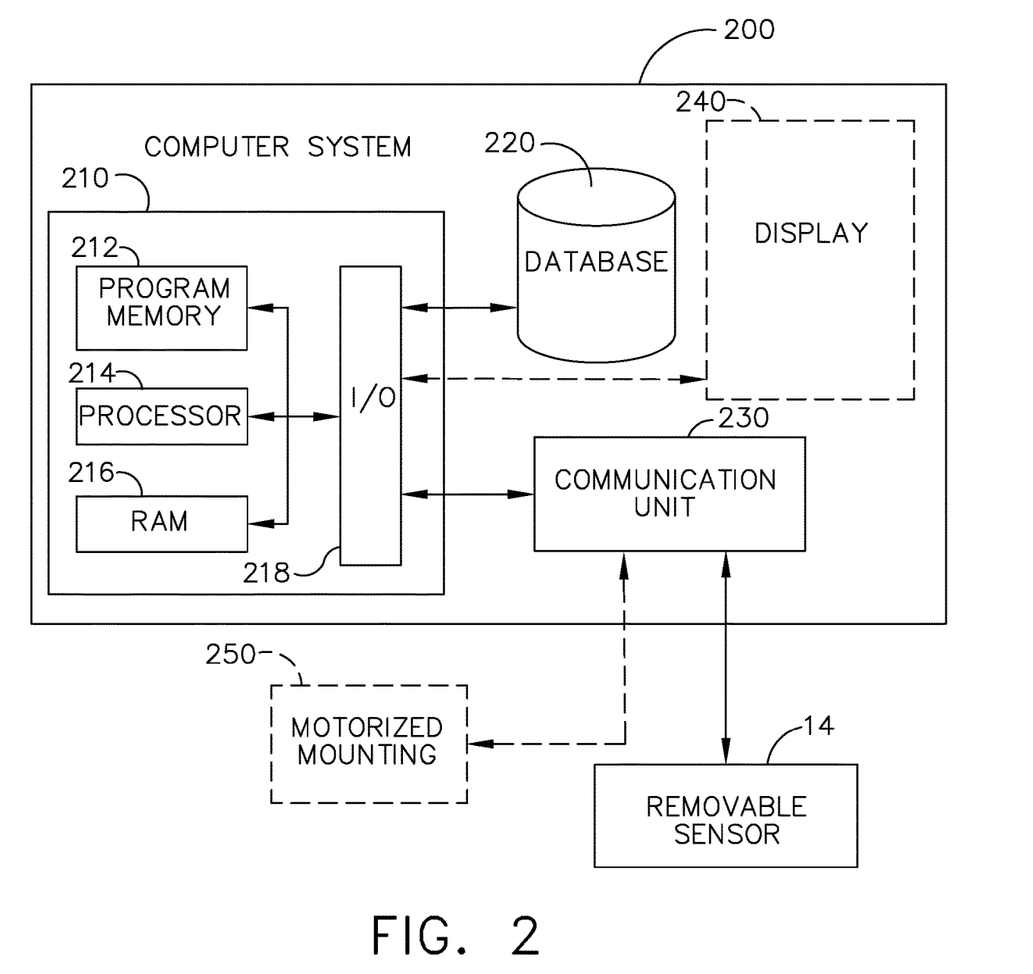
FIG. 2 is a block diagram of computer system for aligning removable sensors.

FIG. 2 illustrates, as a block diagram, a computer system 200 for use in performing part or all of the sensor alignment method 600 described below. In some exemplary embodiments, the computer system 200 is installed within the vehicle 10, while the computer system 200 is communicatively connected to the vehicle 10 in other exemplary embodiments. The computer system is configured to receive or collect sensor output from the one or more removable sensors 14 mounted on the vehicle 10 and to generate a representation of the sensor output for use in aligning the one or more removable sensors 14, as described elsewhere herein. The computer system 200 includes a controller 210, a database 220, and a communication unit 230.

The controller includes one or more of each of the following: a program memory 212, a processor 214, and a random access memory (RAM) 216. Each program memory 212 is a non-transitory, tangible memory device configured to store electronic data, such as executable instructions for implementing processes, routines, and software programs. Each processor 214 is adapted and configured to execute computer-executable instructions, such as software programs, applications, and routines. Each RAM 216 is configured as a volatile memory for storing electronic data while in use.

Each of the program memory 212, processor 214, and RAM 216 is connected to an input/output (I/O) circuit 218, which I/O circuit 218 also connects the controller 210 to the other components of the computer system 200 (i.e., the database 220, the communication unit 230, and any display 240). The database 220 is configured to store electronic data in a non-transitory, tangible memory device for use by software applications. In some embodiments, the database 220 and the program memory 212 may be combined into a single memory. The communication unit 230 is a component of the computer system 200 configured to manage communication between the controller 210 and external devices that are communicatively connected to the computer system 200, such as the removable sensors 14 and any motorized mountings 250 associated with the removable sensors 14.

Although illustrated as connected to the removable sensors 14, the computer system 200 includes the removable sensors 14 in some embodiments in order to improve control of the electronic data from the removable sensors 14. In additional or alternative embodiments, the computer system 200 likewise includes one or more motorized mountings 250 configured to adjust the position and/or orientation of removable sensors 14, as described further below. In further additional or alternative embodiments, the computer system 200 includes a display 240 configured to present visual representations of sensor output from the removable sensors 14 to a user for verification or further use in aligning the removable sensors 14 of the vehicle 10. Additional or alternative embodiments of the computer system 200 may include fewer, additional, or alternative components, as well as any combination of components illustrated in FIG. 2.

Figure 3:
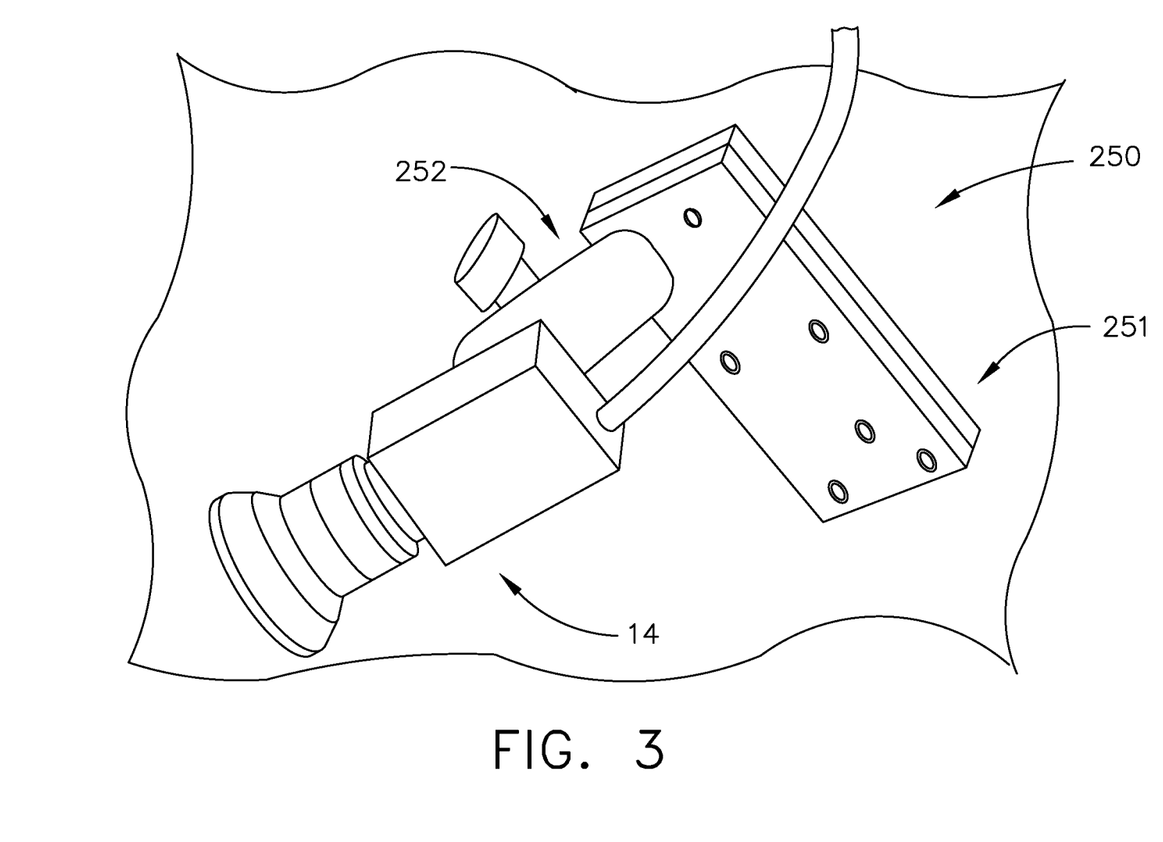
FIG. 3 is a perspective view of an exemplary removable sensor mounted on a vehicle.

FIG. 3 is a perspective view of an example of a removable sensor 14 mounted on a vehicle 10 via a motorized mounting 250. In the illustrated example, the removable sensor 14 is a digital camera mounted to the underside of a wing of an aircraft. In the illustrated example, the motorized mounting 250 is fixedly attached to the vehicle 10 and includes both a motorized translation bed 251 and a motorized gimbal 252, which are electrically controlled by the computer system 200. The motorized translation bed 251 translates the lateral position of the removable sensor 14 relative to the local surface of the vehicle 10 to which the motorized mounting 250 is affixed, thereby enabling the position of the removable sensor 14 to be adjusted relative to the center of the vehicle. The motorized gimbal 252 rotates the removable sensor 14 in three-dimensional space, thereby enabling the orientation of the removable sensor 14 to be adjusted during alignment. Although the illustrated motorized mounting 250 includes both a motorized translation bed 251 and a motorized gimbal 252, either the motorized translation bed 251 or the motorized gimbal 252 may be installed and used independently (i.e., without the other component) in various embodiments. In further embodiments, the removable sensor 14 may be mounted on the vehicle 10 with a mounting that does not include any motorized components, in which case the removable sensor 14 is adjusted manually.

Figure 4:
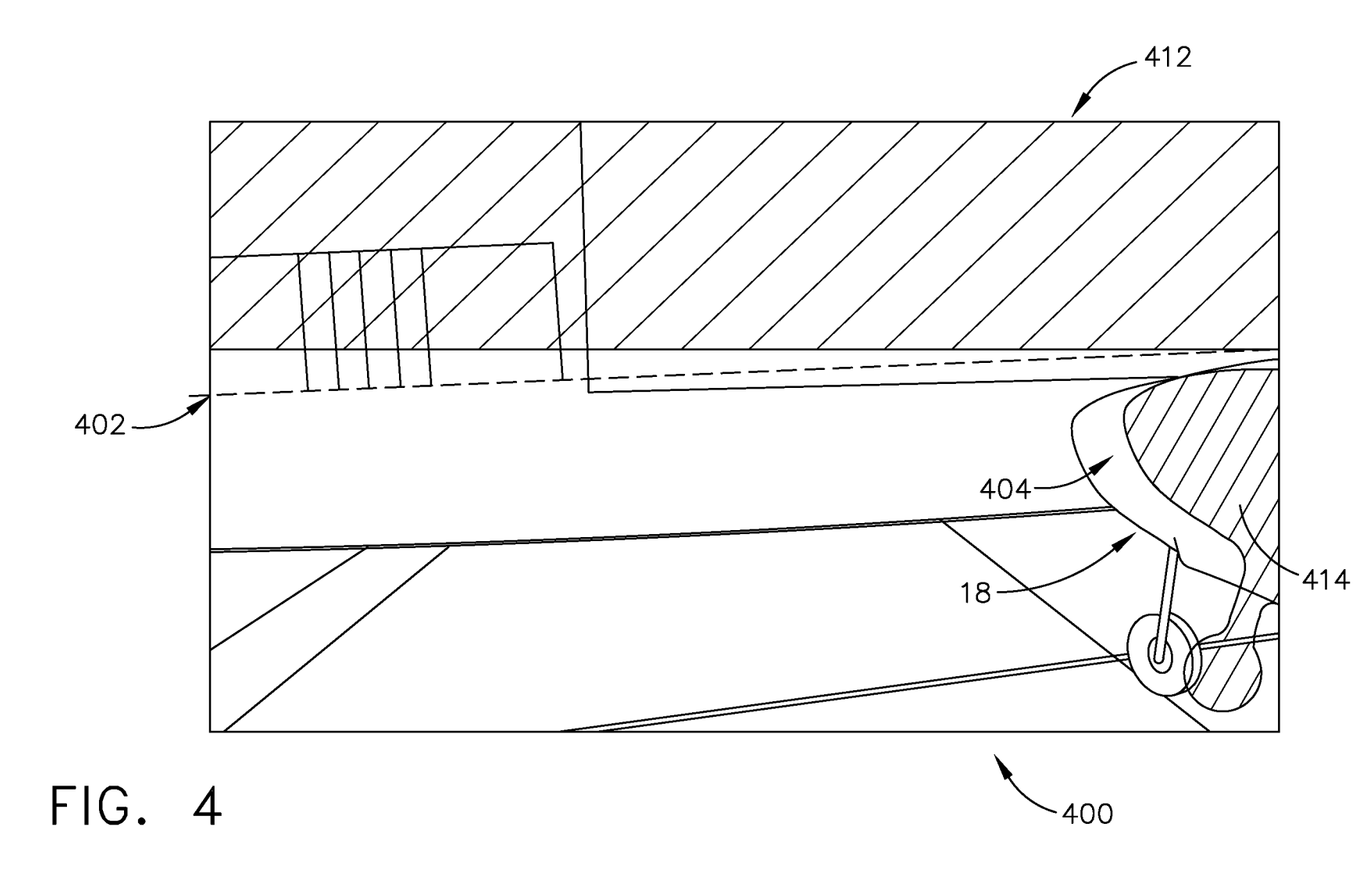
FIG. 4 is a representation of a spatial template overlaid on a representation of sensor output of a removable sensor that is misaligned.
Figure 5:
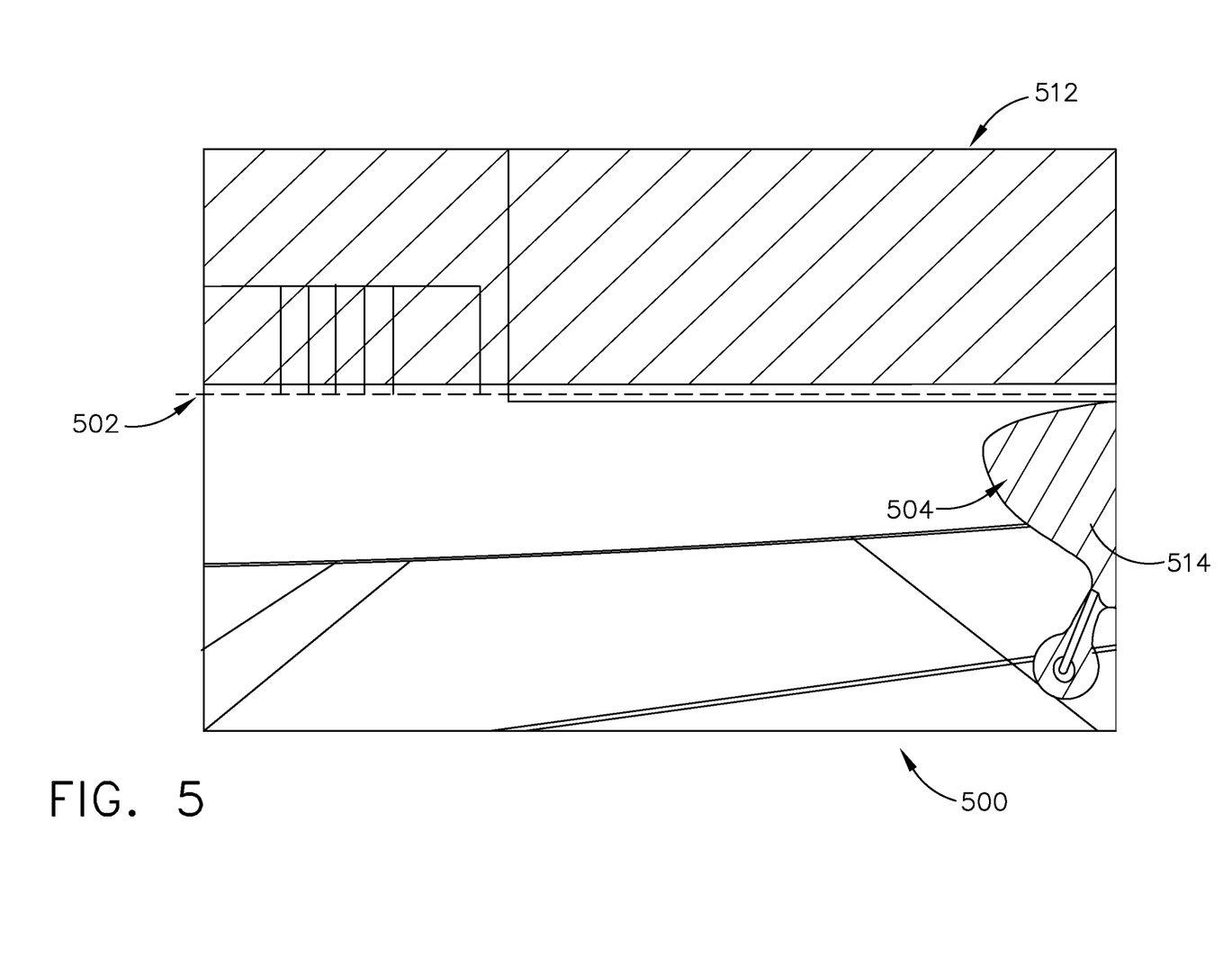
FIG. 5 is a representation of the spatial template overlaid on a representation of sensor output of the removable sensor that is properly aligned.

FIGS. 4 and 5 illustrate the use of spatial templates and representations of sensor output to align a removable sensor 14 mounted on a vehicle 10. FIG. 4 is a representation of a spatial template overlaid on an unaligned visual representation 400 of sensor output of a removable sensor 14. FIG. 5 is a representation of the same spatial template overlaid on an aligned visual representation 500 of sensor output of the removable sensor 14 that is properly aligned. Although the illustrated unaligned and aligned visual representations 400 and 500 in FIGS. 4 and 5 are presented graphically as two-dimensional images to aid description, it should be understood that such representations may be two-dimensional or three-dimensional images (e.g., pixel arrays or voxel point clouds) and need not be actually displayed. In some embodiments, representations such as the unaligned and aligned visual representations 400 and 500 may be visually presented to a user via the display 240 to facilitate alignment of a removable sensor 14. In other embodiments, the computer system 200 may internally process corresponding data representations without visually presenting such representations.

FIG. 4 illustrates the unaligned visual representation 400 of example sensor output of the removable sensor 14, in which the removable sensor 14 is misaligned. The unaligned visual representation 400 is an image of the local environment of a vehicle 10, which in this case is an aircraft 18 with a camera mounted on a wing (not shown) of the aircraft 18. The local environment of the aircraft 18 in the unaligned visual representation 400 includes portions of the ground and background buildings, as well as a vehicle portion 404. A horizon 402 may be determined directly in the representation or indirectly from the alignment of buildings or other features. Such features as the horizon 402 and the vehicle portion 404 may be used as external reference features for sensor alignment, as described further elsewhere herein. The spatial template overlays the unaligned visual representation 400 and is visually depicted as a mask having shaded regions representing reference indicators, including a horizon reference indicator 412 and a vehicle reference indicator 414. As can be seen in FIG. 4, the horizon reference indicator 412 is misaligned with the horizon 402 (indicating a rotation of the camera from a desired position), and the vehicle reference indicator 414 is misaligned with the vehicle portion 404 (indicating a rotation or translation of the camera from a desired position).

FIG. 5 illustrates the aligned visual representation 500 of example sensor output of the removable sensor 14, in which the removable sensor 14 is properly aligned. The local environment of the vehicle 10 illustrated in FIG. 5 is substantially similar to that of the local environment illustrated in FIG. 4, but the removable sensor 14 has been properly aligned. Thus, the horizon reference indicator 512 aligns with the horizon 502, and the vehicle reference indicator 514 aligns with the vehicle portion 504.

Figure 6:
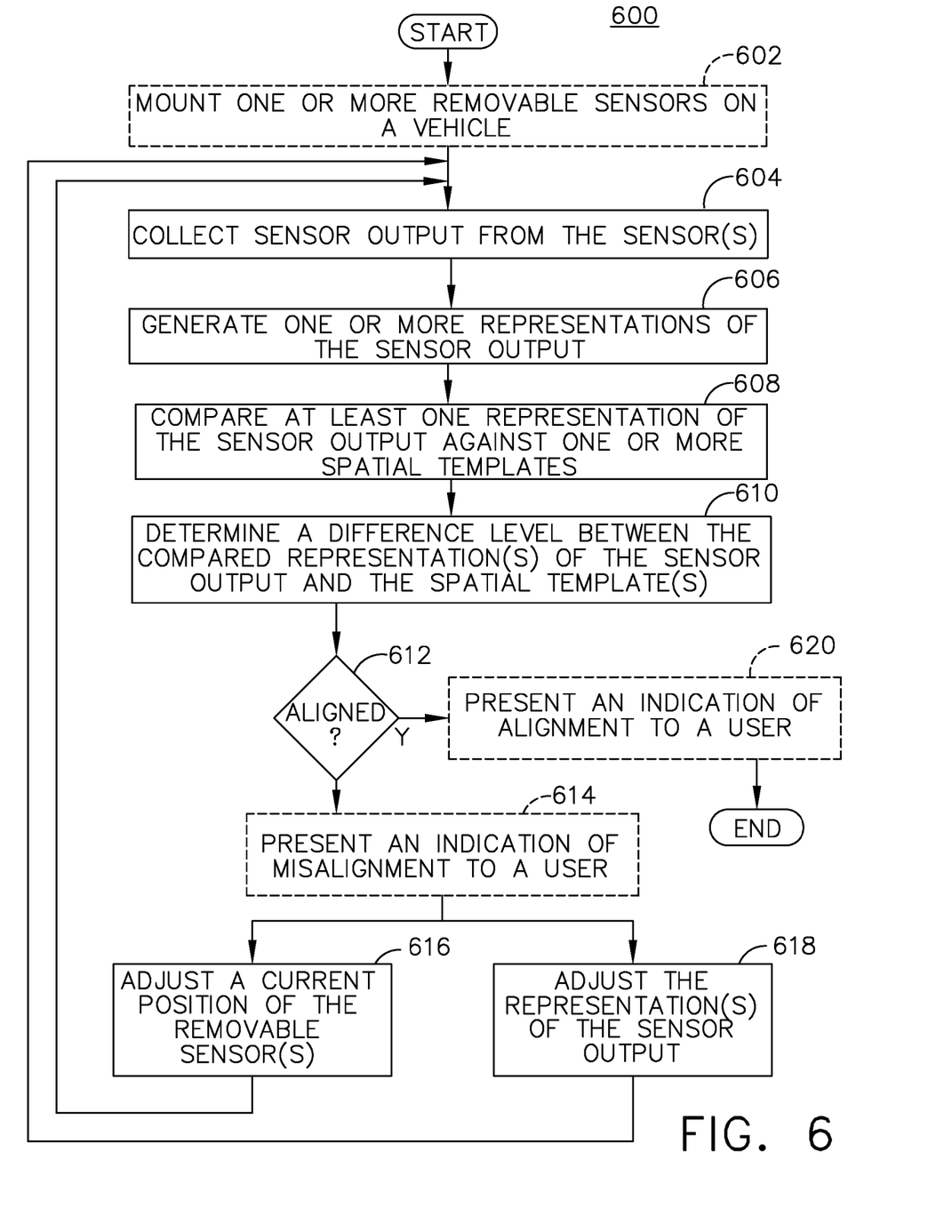
FIG. 6 is a flow diagram of an exemplary sensor alignment method.

FIG. 6 is a flow diagram of a sensor alignment method 600 for aligning one or more removable sensors 14 mounted on a vehicle 10. In some embodiments, the processor 214 of the computer system 200 executes computer-executable instruction stored in the program memory 212 to implement part or all of the sensor alignment method 600. The sensor alignment method 600 is implemented to align one or more removable sensors 14 using sensor output from the one or more removable sensors 14. In some embodiments, the sensor alignment method 600 may be implemented separately for each of a plurality of removable sensors 14 of one or more vehicles 10. Additional, alternative, or fewer aspect may be included in alternative similar methods. Although the sensor alignment method 600 is described herein by reference to the computer system 200 for clarity, other similar computing systems may be used, as will be readily apparent to those of ordinary skill in the art.

At block 602, in some embodiments, one or more removable sensors 14 are mounted on a vehicle 10. For example, the removable sensor 14 mounted on a vehicle 10 via a motorized mounting 250 or via a non-motorized mounting. Such removable sensors 14 will not generally be properly aligned when first mounted, so the sensor alignment method 600 aligns the removable sensors 14 to a desired position and orientation to generate useful sensor output.

At block 604, the computer system 200 collects sensor output from the one or more removable sensors 14 mounted on the vehicle 10. For each removable sensor 14, the computer system 200 collects sensor output generated by the removable sensor 14 at one or more times. The sensor output is generated by the removable sensor 14 as electronic data and transmitted via wired or wireless communication to the computer system 200 through the communication unit 230. The sensor output indicates sensed data regarding a portion of the environment of the vehicle 10, as observed from the current position of the removable sensor 14. In some embodiments, the removable sensor 14 is configured to generate sensor output on an ongoing basis (e.g., periodically at constant intervals), in which case either sensor output at a single time or sensor output at a plurality of times may be collected by the computer system 200. For example, the sensor output may be a video feed including a plurality of electronic data representing still images at a plurality of times. Because the sensor output is associated with the current position of the removable sensor 14, the sensor output likewise changes as the position (e.g., location and/or orientation) of the removable sensor 14 is adjusted.

At block 606, the computer system 200 generates one or more representations of the sensor output collected from the one or more removable sensors 14 to facilitate sensor alignment. Each representation of the sensor output represents a portion of the current local environment of the vehicle 10 as observed from the current position of a removable sensor 14 at a particular time. Such representation may comprise computer-readable data in the program memory 212 (a representation that is not displayed to a user) or may alternatively comprise a visual representation of the sensor data presented to a user via the display 240. In some embodiments, the representation of the sensor output is generated as a digital image including a portion of the vehicle 10 and a portion of the environment of the vehicle 10 in order to provide external reference features from which to align the removable sensor 14 using a corresponding digital mask, as discussed below. For example, representations such as the unaligned visual representation 400 and the aligned visual representation 500 discussed above may be generated by the computer system 200 from the sensor output. In some embodiments, the computer system 200 generates a representation of the sensor output for each removable sensor 14 at each time in order to facilitate sensor alignment in real-time as the removable sensor 14 is adjusted.

At block 608, the computer system 200 compares at least one of the representations of the sensor output against one or more spatial templates. The one or more spatial templates are configured to overlay the representations of the sensor output in order to indicate whether the one or more removable sensors 14 are properly aligned in a desired position.

Each spatial template includes at least one reference indicator to be aligned with an external reference feature in the representation of the sensor output relating to the observed environment of the vehicle 10. Each such reference indicator represents an expected position of an external reference feature in the representation of the sensor output when the removable sensor 14 is in a desired position (i.e., when the removable sensor 14 is properly aligned). Such external reference features may be parts of physical objects in the local physical environment of the vehicle 10 (including portions of the vehicle 10 itself or temporary static alignment objects placed within the environment of the vehicle 10) or may be observable aspects of the local physical environment of the vehicle 10 derivable from the sensor output (such as orienting surfaces or lines). In some embodiments, the one or more reference indicators of the one or more spatial templates include expected spatial positions corresponding to one or more of the following external reference features: one or more portions of the vehicle 10, one or more alignment markings on the surface of the vehicle 10, one or more temporary static alignment objects placed within an environment of the vehicle 10, or a horizon as observed from the position of the removable sensor 14. Use of such external references enables robust performance of the sensor alignment method 600 in many environments. In some embodiments, the spatial template comprises a digital mask including the one or more reference indicators as one or more shapes within digital mask. Such digital mask may include reference indicators relating to portions of the vehicle 10 or other observable aspects of local environment of the vehicle 10, such as the horizon reference indicators 412, 512 and the vehicle reference indicators 414, 514 described above with respect to FIGS. 4 and 5. In additional or alternative embodiments, the digital mask may include one or more reference indicators relating to temporary static alignment objects placed within the local of the vehicle 10 for sensor alignment. For example, temporary static alignment objects (e.g., traffic cones, signs, or targets) may be placed temporarily at specific positions relative to the vehicle 10 (e.g., at a predetermined distance from the vehicle 10 along a centerline 22 of a taxiway 20) to facilitate alignment of one or more removable sensors 14. Such digital masks may simplify comparison by either the computer system 200 or a user via the display 240. Additional or alternative two-dimensional digital masks or three-dimensional digital masks may be used in various embodiments.

As with the one or more representations of the sensor output, the one or more spatial templates may comprise computer-readable data in the program memory 212 (such as a data template that is not displayed to a user) or may alternatively comprise a visual spatial template (such as a visual mask that is displayed to a user). Thus, comparing a representation of the sensor output against a spatial template may be performed automatically by the controller 210 of the computer system 200 or may be performed manually by a user of the computer system 200. To compare a representation of the sensor output against a spatial template, the controller 210 may perform a pixel-wise or bit-wise comparison of one or more portions of the spatial template corresponding to the reference indicators against the corresponding one or more portions of the representation of the sensor output. Alternatively, the controller 210 may perform object determination to extract relevant features (e.g., portions of the vehicle 10, markings, other objects, or a horizon) from the representation of the sensor output and compare the one or more portions of the spatial template corresponding to the reference indicators against such extracted relevant features. To compare a representation of the sensor output against a spatial template, the user of the computer system 200 may review the spatial template as an overlay on the representation of the sensor output displayed at the display 240 to identify areas of overlap between the reference indicators in the spatial template and external features in the representation of the sensor output. The user may likewise identify areas without overlap for which overlap is desired, indicating sensor misalignment.

Because the sensor alignment method 600 may be performed for unaligned sensors in order to align such unaligned sensors and for aligned sensors in order to confirm proper alignment, comparing the one or more spatial templates against the one or more representations of the sensor output may occur prior to performing sensor alignment (i.e., adjusting a current position of a removable sensor 14 or adjusting a representation of the sensor output) or after performing sensor alignment, as described further below. As can be seen by reference to FIG. 6, comparing the one or more spatial templates against the one or more representations of the sensor output may in some instances occur both prior to performing sensor alignment and after performing such sensor alignment over multiple iterations of such comparisons until the one or more removable sensors 14 are sufficiently aligned. Thus, the sensor alignment method 600 is made more flexible and more broadly applicable to sensor alignment under various conditions.

At block 610, a difference level between the at least one representation of the sensor output and the corresponding one or more spatial templates is determined. In some instances, there may be no difference between the representation of the sensor output and the spatial template against which the representation is compared, in which cases the difference level will be determined as zero difference. The difference level represents a level of divergence between one or more portions of the spatial template corresponding to reference indicators and the corresponding one or more portions of the representation of the sensor output corresponding to external references in the environment of the vehicle 10. Although described herein as being evaluated based upon a difference level, the comparison of representations of sensor output and spatial templates may instead by evaluated using a correspondence level, matching level, or other metrics of either differences or matches between a representation of sensor output and a spatial template in alternative embodiments.

As above with respect to block 608, the difference level may be determined automatically by the controller 210 of the computer system 200 or may be determined manually by a user of the computer system 200. When determined automatically, the controller 210 may aggregate the differences between the representation of the sensor output and the spatial template across a plurality of bits or pixels. When determined manually, the user may estimate the degree of overlap or match between the representation of the sensor output and the spatial template.

At block 612, the computer system 200 or a user of the computer system 200 determines whether the one or more removable sensors 14 are properly aligned based upon the difference level determined from the comparison of the at least one representation of sensor output against the one or more spatial templates. In some embodiments, the computer system 200 is configured to determine the one or more removable sensors 14 are sufficiently properly aligned by determining the difference level determined at block 610 does not exceed a tolerance threshold (indicating that the removable sensor 14 is at a current position that is properly aligned to a desired position) and/or is configured to determine the one or more removable sensors 14 are not sufficiently properly aligned by determining the difference level determined at block 610 does exceed the tolerance threshold (indicating that the removable sensor 14 is at a current position that is not properly aligned to a desired position). In further embodiments, the user of the computer system 200 determines whether the one or more removable sensors 14 are sufficiently properly aligned by evaluation of the difference level determined at block 610. As indicated by FIG. 6, the sensor alignment method 600 may perform multiple iterations at a plurality of times, including a time prior to sensor alignment (i.e., when the difference level exceeds the tolerance threshold) and a time after sensor alignment (i.e., when the difference level does not exceed the tolerance threshold). When the one or more removable sensors 14 are determined to be properly aligned, the sensor alignment method 600 continues to block 620 or terminates. When the one or more removable sensors 14 are determined not to be properly aligned, the sensor alignment method 600 continues to block 614 or to one of blocks 616 or 618.

At block 614, in some embodiments, the computer system 200 presents an indication of misalignment of at least one removable sensor 14 to a user via the display 240. Such indication of misalignment may include an indication of the difference level to indicate the degree of misalignment. In some embodiments, the indication of misalignment may include corrective instructions to the user, such as instructions to translate or rotate the position of one or more removable sensors 14. In further embodiments, the indication of misalignment may include a plurality of options presented to the user via the display 240, such as options to automatically align a removable sensor 14 or to manually align such removable sensor 14. In some such embodiments, the options may include an option to adjust a current position of the removable sensor or to adjust the representation of the sensor output to perform the alignment. A use selection of one of such options may determine whether the sensor alignment method 600 proceeds to block 616 or block 618, or whether the sensor alignment method 600 proceeds to manual or automatic alignment. In embodiments in which the sensor alignment method 600 operates on a plurality of removable sensors 14 simultaneously, the indication of misalignment may indicate one or more of the removable sensors 14 requiring alignment in order to assist the user in performing such alignment.

The sensor alignment method 600 may implement either an adjustment to a current position of a removable sensor 14 (block 616) on a vehicle 10 or an adjustment to the representation of the sensor output (block 618). In some instances, the sensor alignment method 600 may repeatedly make such adjustments until the removable sensor 14 is properly aligned over a plurality of iterations, and the same type of adjustment need not occur at each iteration. For example, the sensor alignment method 600 may first adjust the current position of the removable sensor 14 during a first iteration, then adjust the representation of the sensor output from the removable sensor 14 during a second iteration at the adjusted current position.

At block 616, one or more current positions of the one or more removable sensors 14 mounted on the vehicle 10 are adjusted to improve the alignment of the one or more removable sensors 14. Adjusting the current position of a removable sensor 14 may include either or both adjusting a location of the removable sensor 14 on the vehicle 10 or adjusting an orientation of the removable sensor 14 (e.g., by rotation of the removable sensor 14). The current position of each removable sensor 14 is adjusted to position the removable sensor 14 at a desired position on the vehicle 10 based upon the representation of the sensor output and the spatial template, such that one or more external reference features in the representation of the sensor output of the removable sensor 14 at the adjusted current position align with the one or more reference indicators in the spatial template. In some embodiments, adjusting the current position of a removable sensor 14 includes adjusting an orientation of the removable sensor 14 to align one or more external reference features in a digital image with one or more shapes within a digital mask used as the spatial template.

Adjusting the current positions of the one or more removable sensors 14 may be performed manually or automatically. When performed manually, a user may physically adjust the position of each removable sensor 14 needing adjustment, or the user may control a motorized mounting 250 to adjust the position of the removable sensor 14. When performed automatically, the controller 210 of the computer system 200 controls the motorized mounting 250 to adjust the position of each removable sensor 14 needing adjustment. Controlling the motorized mounting 250 includes generating and communicating from the computer system 200 to the motorized mounting 250 an electrical signal to actuate at least one of the motorized translation bed 251 or the motorized gimbal 252 of the motorized mounting 250 to adjust the current position of the one or more removable sensors 14. Such motorized mounting 250 may be used for convenience of the user, for increased efficiency or accuracy, or to facilitate automatic alignment of the removable sensors 14.

At block 618, the computer system 200 adjusts the representation of the sensor output of the one or more removable sensors 14 to simulate the removable sensor 14 being positioned at the desired position. Thus, in some embodiments, the representation of the sensor output is aligned without requiring physically adjusting the position of the removable sensor 14, thereby reducing error and cost. Such alignment may include any of the following, separately or in any combination: rotating the representation of the sensor output, translating the representation of the sensor output, or scaling the representation of the sensor output. In some embodiments, adjusting the representation of the sensor output at the current position of the removable sensor 14 includes applying one or more of a translation or a rotation of the representation of the sensor output to align one or more external reference features in a digital image with one or more shapes within a digital mask used as the spatial template. In various embodiments, adjustments to the representation of the sensor output of the one or more removable sensors 14 may be determined automatically by the controller 210 of the computer system (by identifying the best match between the adjusted representation of the sensor output and the spatial template) or manually by a user (by user input of adjustment instructions to the computer system 200 to obtain alignment between the adjusted representation of the sensor output and the spatial template).

Following alignment of the one or more removable sensors 14 by adjustment of current positions of such removable sensors 14 or adjustment of representations of sensor output of such removable sensor 14, the sensor alignment method 600 returns to collecting sensor output from the one or more removable sensors 14 at block 604. The sensor alignment method 600 then performs further analysis at block 606-612, as described above. Further adjustments to align the one or more removable sensor 14 may be required, or the removable sensors 14 may be determined to be sufficiently properly aligned at block 612.

When the computer system 200 determines that the one or more removable sensors 14 are properly aligned at block 612, the sensor alignment proceeds, in some embodiments, to block 620. At block 620, in some embodiments, the computer system 200 presents an indication of alignment of at least one removable sensor 14 to a user via the display 240 to notify the user that the one or more removable sensors 14 are properly aligned. For example, the computer system 200 may determine a removable sensor 14 has been properly aligned and present the indication of alignment to the user as confirmation of such alignment. In some such embodiments, a record of sensor alignment may be stored in the database 220 for future verification. The sensor alignment method 600 then terminates.

While various embodiments have been described above, this disclosure is not intended to be limited thereto. Variations can be made to the disclosed embodiments that are still within the scope of the appended claims.

What is claimed:

1. A method for aligning a removable sensor mounted remounted on a vehicle to provide repeatable alignment of the removable sensor relative to the vehicle, comprising:
    collecting sensor output from the removable sensor at each of a plurality of times, wherein the sensor output at each of the plurality of times is associated with a current position of the removable sensor on the vehicle;
    generating, by one or more processors, a representation of the sensor output at each of the plurality of times;
    adjusting either (i) the current position of the removable sensor based upon the representation of the sensor output and a spatial template including one or more reference indicators to position the removable sensor at a desired position on the vehicle, or (ii) the representation of the sensor output at the current position of the removable sensor to simulate the removable sensor being positioned at the desired position on the vehicle based upon the spatial template;
    overlaying the spatial template on the representation of the sensor output to indicate whether an expected position of the one or more reference indicators of the spatial template aligns with the representation of the sensor output; and
    adjusting the removable sensor when the current position is unaligned from the expected position to realign the removable sensor to the desired position which aligns with the expected position.

2. The method of claim 1, wherein the removable sensor includes an imaging sensor, wherein:
    generating the representation of the sensor output at each of the plurality of times includes generating a digital image, from the imaging sensor, including a portion of an environment of the vehicle; and
    the spatial template comprises a digital mask including the one or more reference indicators as one or more shapes within the digital mask.

3. The method of claim 2, comprising adjusting the current position of the removable sensor, wherein adjusting the current position of the removable sensor based upon the representation of the sensor output and the spatial template includes adjusting an orientation of the removable sensor to align one or more external reference features in the representation of the sensor output in the digital image with the one or more shapes within the digital mask.

4. The method of claim 2, comprising adjusting the representation of the sensor output at the current position of the removable sensor, wherein adjusting the representation of the sensor output at the current position of the removable sensor includes applying one or more of a translation or a rotation of the representation of the sensor output to align one or more external reference features in the representation of the sensor output in the digital image with the one or more shapes within the digital mask.

5. The method of claim 1, wherein one or more external reference features in the representation of the sensor output include a horizon.

6. The method of claim 1, wherein one or more external reference features in the representation of the sensor output include one or more of: a portion of the vehicle or alignment markings on a surface of the vehicle.

7. The method of claim 1, wherein one or more external reference features in the representation of the sensor output include one or more temporary static alignment objects placed within an environment of the vehicle.

8. The method of claim 1, further comprising:
    comparing, by the one or more processors, a portion of the spatial template against a corresponding portion of the representation of the sensor output at a time of the plurality of times, wherein the time occurs prior to adjusting the current position of the removable sensor or the representation of the sensor output;
    determining, by the one or more processors, a difference level between the portion of the spatial template and the corresponding portion of the representation of the sensor output; and
    determining, by the one or more processors, the difference level exceeds a tolerance threshold.

9. The method of claim 1, further comprising:
    comparing, by the one or more processors, a portion of the spatial template against a corresponding portion of the representation of the sensor output at a time of the plurality of times, wherein the time occurs after adjusting the current position of the removable sensor or the representation of the sensor output;
    determining, by the one or more processors, a difference level between the portion of the spatial template and the corresponding portion of the representation of the sensor output; and
    determining, by the one or more processors, the difference level does not exceed a threshold.

10. The method of claim 1, wherein adjusting the position of the removable sensor includes controlling a motorized gimbal to adjust the position of the removable sensor.

11. A computer system for aligning a removable sensor remounted on a vehicle to provide repeatable alignment of the removable sensor relative to the vehicle, comprising:
    one or more processors communicatively connected to the removable sensor; and
    a program memory communicatively connected to the one or more processors and storing executable instructions that, when executed by the one or more processors, cause the computer system to:
        collect sensor output from the removable sensor at each of a plurality of times, wherein the sensor output at each of the plurality of times is associated with a current position of the removable sensor on the vehicle;
        generate a representation of the sensor output at each of the plurality of times;
        adjust either (i) the current position of the removable sensor based upon the representation of the sensor output and a spatial template including one or more reference indicators to position the removable sensor at a desired position on the vehicle, or (ii) the representation of the sensor output at the current position of the removable sensor to simulate the removable sensor being positioned at the desired position on the vehicle based upon the spatial template;

overlay the spatial template on the representation of the sensor output to indicate whether an expected position of the one or more reference indicators of the spatial template aligns with the representation of the sensor output; and adjust the removable sensor when the current position is unaligned from the expected position to realign the removable sensor to the desired position which aligns with the expected position.

12. The computer system of claim 11, wherein:
the executable instructions that cause the computer system to generate the representation of the sensor output at each of the plurality of times cause the computer system to generate a digital image including a portion of the vehicle and a portion of an environment of the vehicle; and the spatial template comprises a digital mask including the one or more reference indicators as one or more shapes within the digital mask.

13. The computer system of claim 12, wherein the executable instructions cause the computer system to adjust the current position of the removable sensor by adjusting an orientation of the removable sensor to align one or more external reference features in the representation of the sensor output in the digital image with the one or more shapes within the digital mask.

14. The computer system of claim 12, the executable instructions cause the computer system to adjust the representation of the sensor output at the current position of the removable sensor by applying one or more of a translation or a rotation of the representation of the sensor output to align one or more external reference features in the representation of the sensor output in the digital image with the one or more shapes within the digital mask.

15. The computer system of claim 11, further comprising one or more of a motorized gimbal or a motorized translation bed, wherein the executable instructions that cause the computer system to adjust the current position of the removable sensor cause at least one of the motorized gimbal or the motorized translation bed to adjust the current position of the removable sensor.

16. The computer system of claim 11, wherein the vehicle is an aircraft.

17. A tangible, non-transitory computer-readable medium storing executable instructions for aligning a removable sensor remounted on a vehicle to provide repeatable alignment of the removable sensor relative to the vehicle that, when executed by one or more processors of a computer system, cause the computer system to:

collect sensor output from the removable sensor at each of a plurality of times, wherein the sensor output at each of the plurality of times is associated with a current position of the removable sensor on the vehicle;

generate a representation of the sensor output at each of the plurality of times; and determine whether the removable sensor is aligned with a desired position on the vehicle based upon the representation of the sensor output and a spatial template including one or more reference indicators by comparing a portion of the spatial template against a corresponding portion of the representation of the sensor output at a time of the plurality of times, wherein the spatial template is overlayed on the representation of the sensor output to indicate whether an expected position of the one or more reference indicators of the spatial template aligns with the representation of the sensor output, and cause the computer system to instruct adjustments of the removable sensor when the current position is unaligned from the expected position to realign the removable sensor to the desired position which aligns with the expected position.

18. The tangible, non-transitory computer-readable medium of claim 17, wherein the executable instructions that cause the computer system to determine whether the removable sensor is aligned with the desired position on the vehicle further cause the computer system to:

determine a difference level between the portion of the spatial template and the corresponding portion of the representation of the sensor output; and determine whether the difference level exceeds a threshold.

19. The tangible, non-transitory computer-readable medium of claim 18, wherein the executable instructions further cause the computer system to, when the difference level exceeds the threshold:

adjust the current position of the removable sensor to position the removable sensor at the desired position by adjusting an orientation of the removable sensor to align one or more external reference features in the representation of the sensor output in the representation of the sensor output with the one or more reference indicators in the spatial template.

20. The tangible, non-transitory computer-readable medium of claim 18, wherein the executable instructions further cause the computer system to, when the difference level exceeds the threshold:

adjust the representation of the sensor output at the current position of the removable sensor to simulate the removable sensor being positioned at the desired position on the vehicle based upon the spatial template by applying one or more of a translation or a rotation of the representation of the sensor output to align one or more external reference features in the representation of the sensor output in the representation of the sensor output with the one or more reference indicators in the spatial template.

21. The tangible, non-transitory computer-readable medium of claim 18, wherein the executable instructions further cause the computer system to, when the difference level does not exceed the threshold:

present an indication of alignment to a user of the computer system via a display.

* * * * *

UNITED STATES PATENT AND TRADEMARK OFFICE
CERTIFICATE OF CORRECTION

Page 1 of 1

PATENT NO. : 12,123,983 B2
APPLICATION NO. : 16/393388
DATED : October 22, 2024
INVENTOR(S) : Nick S. Evans, Eric R. Muir and Kevin S. Callahan It is certified that error appears in the above-identified patent and that said Letters Patent is hereby corrected as shown below:

In the Claims

Claim 1, Column 11, Lines 24-25: "sensor mounted remounted" should read --sensor remounted--;
Claim 8, Column 12, Line 33: "a tolerance threshold" should read --a threshold--.

Signed and Sealed this
Tenth Day of December, 2024

Katherine Kelly Vidal
*Director of the United States Patent and Trademark Office*